(12) United States Patent
Sato

(10) Patent No.: US 12,557,650 B2
(45) Date of Patent: Feb. 17, 2026

(54) SEMICONDUCTOR MODULE

(71) Applicant: FUJI ELECTRIC CO., LTD., Kawasaki (JP)

(72) Inventor: Tadahiko Sato, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 323 days.

(21) Appl. No.: 18/176,035

(22) Filed: Feb. 28, 2023

(65) Prior Publication Data
US 2023/0335460 A1 Oct. 19, 2023

(30) Foreign Application Priority Data

Apr. 13, 2022 (JP) ................................. 2022-066388

(51) Int. Cl.
*H01L 23/00* (2006.01)
*H01L 23/373* (2006.01)
(Continued)

(52) U.S. Cl.
CPC .......... *H01L 23/3735* (2013.01); *H01L 24/32* (2013.01); *H01L 24/40* (2013.01);
(Continued)

(58) Field of Classification Search
CPC ..... H01L 23/3735; H01L 24/32; H01L 24/40; H01L 24/73; H01L 25/0655;
(Continued)

(56) References Cited

U.S. PATENT DOCUMENTS

2008/0087994 A1 4/2008 Yokomae et al.
2014/0217569 A1* 8/2014 Ishibashi ................. H01L 23/50
438/107

(Continued)

FOREIGN PATENT DOCUMENTS

JP 2004319740 A 11/2004
JP 2008098586 A 4/2008
(Continued)

OTHER PUBLICATIONS

Office Action issued in corresponding JP application No. JP2022-066388 dated Dec. 23, 2025.

*Primary Examiner* — Elias Ullah
(74) *Attorney, Agent, or Firm* — Rabin & Berdo, P.C.

(57) ABSTRACT

A semiconductor module includes a laminate substrate including an insulating plate and first and second circuit boards on an upper surface of the insulating plate, the first semiconductor device on an upper surface of the first circuit board, a first main terminal, and a first metal wiring board that electrically connects the first semiconductor device to the first main terminal. The first metal wiring board has a first bonding section bonded to an upper surface electrode of the first semiconductor device, a second bonding section bonded to an upper surface of the second circuit board, a first coupling section that couples the first bonding section to the second bonding section, a first raised section that rises upward from an end portion of the second bonding section. The first raised section has an upper end that is electrically connected to the first main terminal.

16 Claims, 9 Drawing Sheets

(51) Int. Cl.
*H01L 25/065* (2023.01)
*H01L 23/498* (2006.01)

(52) U.S. Cl.
CPC .......... *H01L 24/73* (2013.01); *H01L 25/0655* (2013.01); *H01L 23/49844* (2013.01); *H01L 2224/32225* (2013.01); *H01L 2224/4001* (2013.01); *H01L 2224/40095* (2013.01); *H01L 2224/40225* (2013.01); *H01L 2224/73263* (2013.01); *H01L 2924/1203* (2013.01); *H01L 2924/13055* (2013.01); *H01L 2924/16315* (2013.01); *H01L 2924/17151* (2013.01); *H01L 2924/182* (2013.01)

(58) Field of Classification Search
CPC ..... H01L 23/49844; H01L 2224/32225; H01L 2224/4001; H01L 2224/40095; H01L 2224/40225; H01L 2224/73263; H01L 2924/1203; H01L 2924/13055; H01L 2924/16315; H01L 2924/17151; H01L 2924/182; H01L 23/053; H01L 23/24; H01L 23/49811; H01L 24/41; H01L 25/072; H01L 23/04; H01L 23/14; H01L 23/367; H01L 23/3736; H02M 7/003; H02M 7/537
See application file for complete search history.

(56) References Cited

U.S. PATENT DOCUMENTS

| | | |
|---|---|---|
| 2016/0343590 A1 | 11/2016 | Yoshihara et al. |
| 2021/0013141 A1 | 1/2021 | Nakayama et al. |
| 2021/0280549 A1 | 9/2021 | Kato et al. |
| 2021/0280550 A1 | 9/2021 | Kato et al. |
| 2021/0280555 A1 | 9/2021 | Murata et al. |
| 2021/0358832 A1 | 11/2021 | Choi |

FOREIGN PATENT DOCUMENTS

| | | |
|---|---|---|
| JP | 2010219419 A | 9/2010 |
| JP | 2014154611 A | 8/2014 |
| JP | 2014204006 A | 10/2014 |
| JP | 2015149326 A | 8/2015 |
| JP | 2016054330 A | 4/2016 |
| JP | 2021141219 A | 9/2021 |
| JP | 2021141221 A | 9/2021 |
| JP | 2021141222 A | 9/2021 |
| WO | 2020071102 A1 | 4/2020 |

* cited by examiner

SEMICONDUCTOR MODULE

CROSS REFERENCE TO RELATED APPLICATIONS

This application is based upon and claims the benefit of priority of the prior Japanese Patent Application No. 2022-066388, filed on Apr. 13, 2022, the entire contents of which are incorporated herein by reference.

BACKGROUND OF THE INVENTION

Field of the Invention

The present invention relates to a semiconductor module.

Description of the Related Art

A semiconductor module includes a substrate provided with a semiconductor device such as an IGBT (insulated gate bipolar transistor), a power MOSFET (metal oxide semiconductor field effect transistor), or an FWD (free wheeling diode), and is used for an inverter apparatus or the like (see, e.g., Japanese Patent Laid-Open Nos. 2021-141219, 2021-141221, 2021-141222, 2010-219419, International Publication No. WO2020/071102, and Japanese Patent Laid-Open Nos. 2008-098586 and 2004-319740).

Japanese Patent Laid-Open No. 2021-141219 describes a semiconductor module in which a gate relay layer 27 and a source relay layer 28 are each arranged as a control circuit board at the center of a plurality of semiconductor devices forming one arm. Japanese Patent Laid-Open No. 2021-141221 describes a semiconductor module in which a plurality of circuit boards each having a semiconductor device arranged therein are formed in a U shape in a planar view and are in a mirror image arrangement. Japanese Patent Laid-Open No. 2021-141222 describes a semiconductor module in which a plurality of circuit boards each having a semiconductor device arranged therein are formed to extend in a predetermined direction and are arranged side by side in a direction intersecting the predetermined direction. Japanese Patent Laid-Open No. 2010-219419 describes a lead frame as a connection conductor having a Ω shape. International Publication No. WO2020/071102 describes a lead frame having a crosslinking portion that connects a chip bonding portion and a wiring bonding portion to each other. Japanese Patent Laid-Open No. 2008-098586 describes a metal plate 24 having a projection 24a in its portion corresponding to an intermediate portion between adjacent semiconductor devices. Japanese Patent Laid-Open No. 2004-319740 describes a lead frame 6 formed to be bent in a reverse U shape.

SUMMARY OF THE INVENTION

In an existing semiconductor module, a semiconductor device and a main terminal (external terminal) are connected to each other via a substrate to dissipate heat to be generated by the semiconductor device from a substrate in order to prevent the heat to be generated by the semiconductor device from being transferred to the main terminal. An example of the existing semiconductor module is one further including a metal wiring board for connecting a substrate and a main terminal to each other in addition to a metal wiring board for connecting a semiconductor device and the substrate to each other.

However, in the semiconductor module thus configured, the number of metal wiring boards increases, and a mounting area of the metal wiring boards on the substrate increases. Accordingly, there is a concern that the semiconductor module may increase in size.

The present invention has been made in view of such points, and is directed to preventing a semiconductor module from increasing in size while preventing heat to be generated by a semiconductor device from being transferred to a main terminal.

According to an aspect of the present invention, a semiconductor module includes a laminate substrate in which at least a first circuit board and a second circuit board are arranged on an upper surface of an insulating plate, a first semiconductor device arranged on an upper surface of the first circuit board, a first main terminal, and a first metal wiring board that electrically connects the first semiconductor device and the first main terminal to each other, in which the first metal wiring board includes a first bonding section bonded to an upper surface electrode of the first semiconductor device, a second bonding section bonded to an upper surface of the second circuit board, a first coupling section that couples the first bonding section and the second bonding section to each other, and a first raised section that rises upward from an end portion of the second bonding section, and an upper end of the first raised section is electrically connected to the first main terminal.

According to the present invention, it is possible to prevent a semiconductor module from increasing in size while preventing heat to be generated by a semiconductor device from being transferred to a main terminal.

DETAILED DESCRIPTION OF THE PREFERRED EMBODIMENT

A semiconductor module according to an embodiment will be described below. A semiconductor module described below is merely an example and is not limited to this, but is appropriately changeable.

Figure 1:
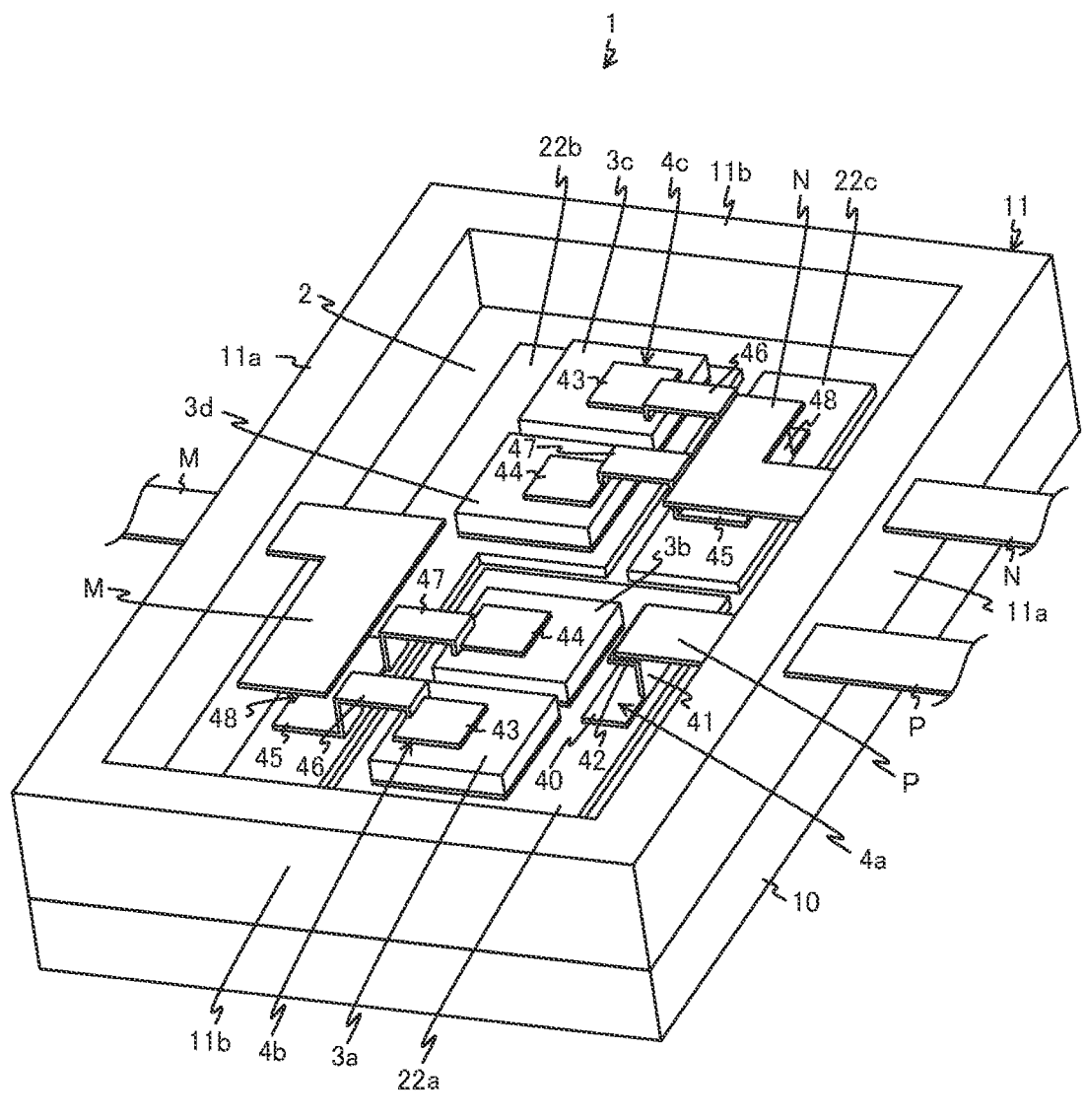
FIG. 1 is a perspective view of a semiconductor module according to an embodiment.
Figure 2A:
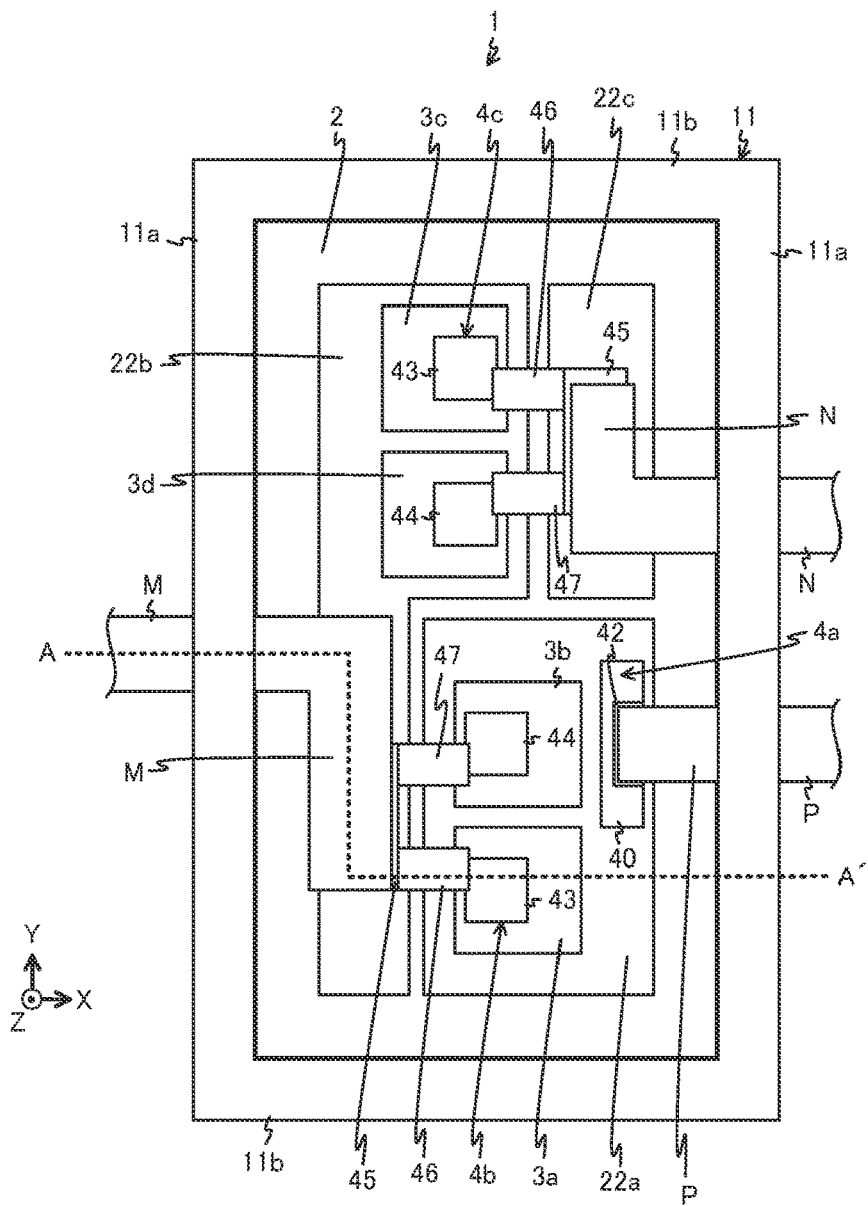
FIGS. 2A and 2B are respectively a plan view and a cross-sectional view of the semiconductor module according to the embodiment.
Figure 2B:
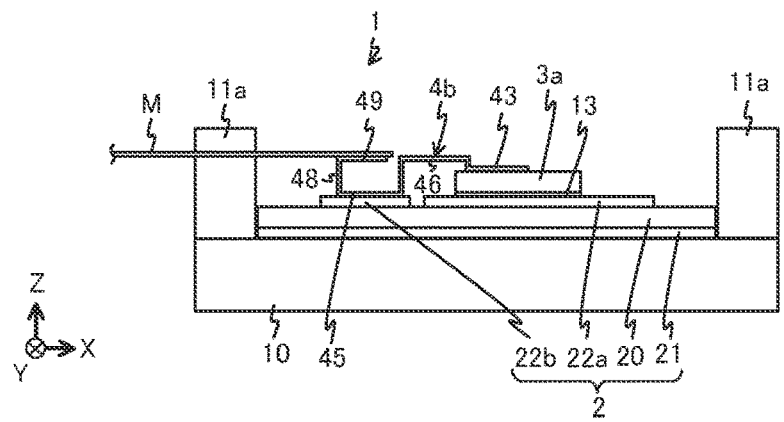
Figure 3:
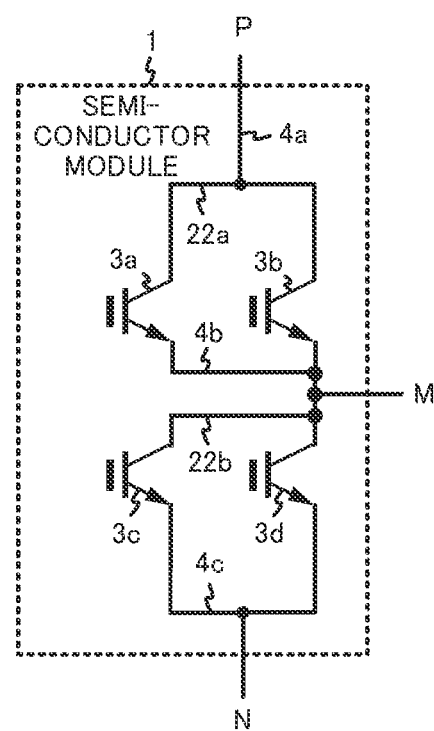
FIG. 3 is a diagram illustrating an equivalent circuit of the semiconductor module according to the embodiment.
Figure 4A:
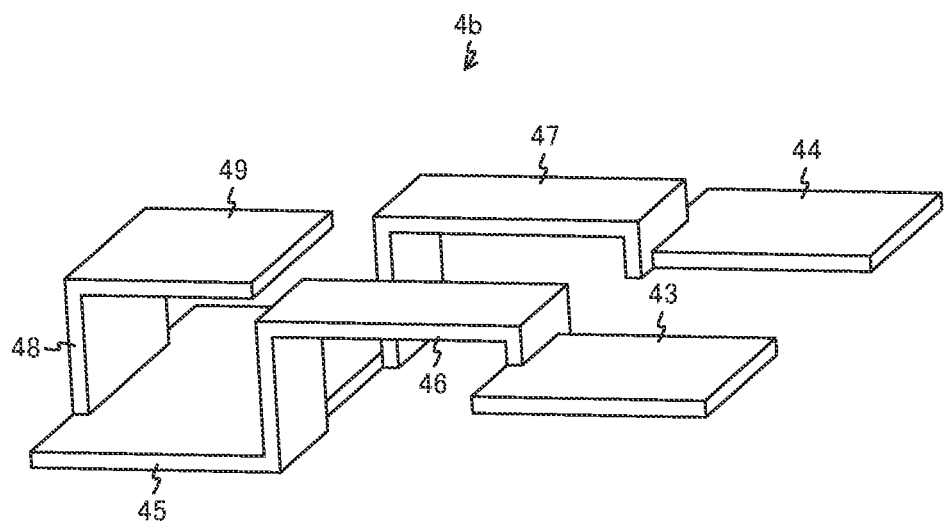
FIGS. 4A and 4B are respectively a perspective view and a plan view of a metal wiring board.
Figure 4B:
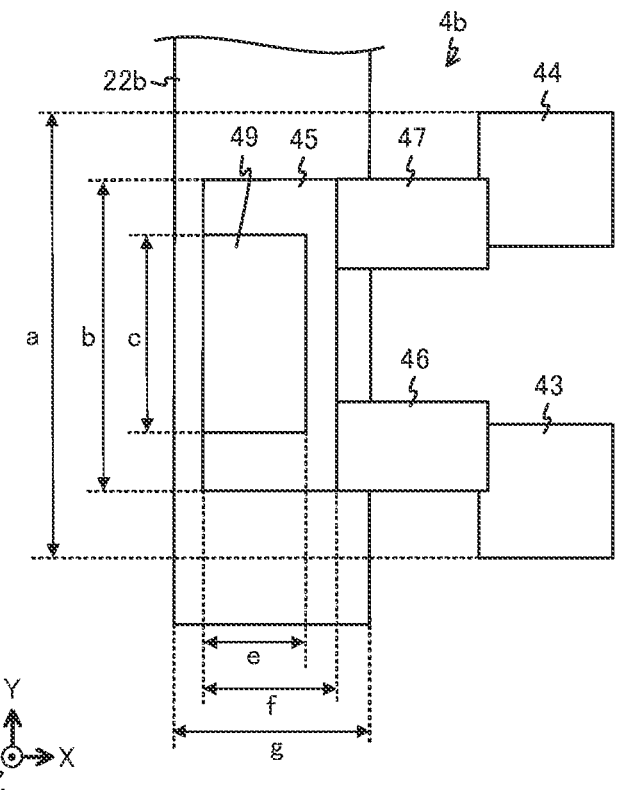

FIG. 1 is a perspective view of a semiconductor module according to an embodiment. FIG. 2A is a plan view of the semiconductor module according to the embodiment, and FIG. 2B is a cross-sectional view taken along a line A-A' of the semiconductor module illustrated in FIG. 2A. FIG. 3 is a diagram illustrating an equivalent circuit of the semiconductor module according to the embodiment. FIG. 4A is a perspective view of a metal wiring board illustrated in FIG. 1, and FIG. 4B is a plan view of the metal wiring board illustrated in FIG. 1. In the following drawings, a direction in which a main terminal (external terminal) extends outside a semiconductor module, a direction in which semiconductor devices are arranged side by side, and a height direction are respectively defined as an X-direction, a Y-direction, and a Z-direction. The X-, Y-, and Z-directions are perpendicular to one another, to form three-dimensional coordinates. The X-direction, the Y-direction, and the Z-direction may be respectively referred to as a left-right direction, a front-rear direction, and an up-down direction. The directions (front-rear, left-right, and up-down directions) are phrases used for convenience of illustration, and a correspondence with each of the X-, Y-, and Z-directions may change depending on an attachment posture of the semiconductor module. For example, the heat dissipation surface side (coolant side) of the semiconductor module and the opposite side thereof may be respectively referred to as the lower surface side and the upper surface side. In this specification, a planar view means a case where an upper surface of the semiconductor module is viewed from the positive side in the Z-direction.

A semiconductor module 1 illustrated in FIGS. 1 and 2 constitutes an inverter circuit. If three semiconductor modules 1 are connected in parallel with each other, for example, the three semiconductor modules 1 constitute a three-phase inverter circuit. In this case, the semiconductor module 1 illustrated in FIGS. 1 and 2 corresponds to an inverter circuit having any one of a U phase, a V phase, and a W phase of the three-phase inverter circuit.

The semiconductor module 1 illustrated in FIGS. 1 and 2 includes a coolant 10, a laminate substrate 2 arranged on the coolant 10, four semiconductor devices 3a to 3d arranged on the laminate substrate 2, a case 11 accommodating the laminate substrate 2 and the semiconductor devices 3a to 3d, and sealing resin (not illustrated) with which the case 11 is filled.

The coolant 10 is a rectangular plate having an upper surface and a lower surface. The coolant 10 has a cooling function. The coolant 10 has a rectangular shape in a planar view extending in the Y-direction. The coolant 10 is a metal plate composed of copper, aluminum, or their alloy, for example, and may be subjected to plating processing on its surface.

The case 11 having a rectangular shape in a planar view and like a frame is arranged on the upper surface of the coolant 10. The case 11 is molded by synthetic resin, for example, and is bonded to the upper surface of the coolant 10 using an adhesive or the like. The case 11 has a shape along an external shape of the coolant 10, and is formed like a frame by connecting a pair of side wall portions 11a opposing each other in the X-direction and a pair of side wall portions 11b opposing each other in the Y-direction at its four corners. A stepped portion lowered by one step may be formed inside an upper surface of the side wall portion 11a on one of the pair of side wall portions 11a opposing each other in the X-direction, and a gate terminal and a source terminal (not illustrated) may be each embedded as a control terminal on an upper surface of the stepped portion. Each of the gate terminal and the source terminal is arranged such that its end portion is exposed to the upper surface of the stepped portion, and is connected to the semiconductor devices 3a to 3d by a wire (not illustrated). As a material for the wire, any one of gold, copper, aluminum, a gold alloy, a copper alloy, and an aluminum alloy, or their combination, for example, can be used.

In the pair of side wall portions 11a opposing each other in the X-direction of the case 11, an external terminal M (an output terminal) is provided as a main terminal to be connected to an external power path on the negative side in the X-direction, and an external terminal P (a positive-side input terminal) and an external terminal N (a negative-side input terminal) are each provided as a main terminal to be connected to an external power path on the positive side in the X-direction.

Each of the external terminals M, P, and N is formed through press working or the like using a metal material such as a copper material, a copper alloy-based material, an aluminum alloy-based material, or an iron alloy-based metal material.

The laminate substrate 2 is arranged on the upper surface of the coolant 10 inside the case 11. The laminate substrate 2 is formed by laminating a metal layer and an insulating layer, and is composed of a DCB (direct copper bonding) substrate, an AMB (active metal brazing) substrate, or a metal base substrate, for example. Specifically, the laminate substrate 2 includes an insulating layer 20, a heat dissipation layer 21 arranged on a lower surface of the insulating layer 20, and a plurality of conductive layers (circuit boards) 22a to 22c arranged on an upper surface of the insulating layer 20. The laminate substrate 2 is formed in a rectangular shape in a planar view, for example.

The insulating layer 20 has a predetermined thickness in the Z-direction, and is formed in a flat plate shape having an upper surface and a lower surface. The insulating layer 20 is formed of an insulating material such as a ceramics material such as alumina ($Al_2O_3$), aluminum nitride (AlN), or silicon nitride ($Si_3N_4$), a resin material such as epoxy, or an epoxy resin material using a ceramics material as a filler. The insulating layer 20 may also be referred to as an insulating film.

The heat dissipation plate 21 has a predetermined thickness in the Z-direction, and is formed to cover the entire lower surface of the insulating layer 20. The heat dissipation plate 21 is formed of a metal plate having a good thermal conductivity such as copper or aluminum.

On the upper surface (main surface) of the insulating layer 20, the plurality of conductive layers 22a to 22c are independently arranged in an island shape with the conductive layers electrically insulated from one another. Each of the plurality of conductive layers 22a to 22c is composed of a metal having a predetermined thickness formed of a copper foil or the like.

The conductive layer 22a is formed at a position connectable to the semiconductor devices 3a and 3b and a metal wiring board 4a. On an upper surface of the conductive layer 22a, the semiconductor devices 3a and 3b are each arranged with a bonding material 13 such as a solder interposed therebetween, and the metal wiring board 4a is arranged.

The conductive layer 22b is formed at a position connectable to the semiconductor devices 3c and 3d and a metal wiring board 4b. On an upper surface of the conductive layer 22b, the semiconductor devices 3c and 3d are each arranged with a bonding material (not illustrated) such as a solder interposed therebetween, and the metal wiring board 4b is arranged.

The conductive layer 22c is formed at a position connectable to a metal wiring board 4c.

The metal wiring boards 4a to 4c are respectively bonded to the upper surfaces of the conductive layers 22a to 22c using a solder, an ultrasonic wave, a sintering material, or laser welding, for example. Each of the metal wiring boards 4a to 4c may be referred to as a lead frame.

Each of the semiconductor devices 3a to 3d is formed in a square shape in a planar view using silicon (Si), silicon carbide (SiC), gallium nitride (GaN), or the like, and is configured as an RC (reverse conducting)-IGBT element obtained by integrating respective functions of an IGBT (insulated gate bipolar transistor) element and an FWD (free wheeling diode) element. Each of the semiconductor devices 3a to 3d is not limited to an RC-IGBT, but may be configured as a transistor such as an IGBT, a power MOSFET (metal oxide semiconductor field effect transistor), or a BJT (bipolar junction transistor), or may be configured by combining a diode such as an FWD (free wheeling diode) with the transistor. Each of the semiconductor devices 3a to 3d may be configured as an RB (reverse blocking)-IGBT having a sufficient withstand voltage against a reverse bias. A shape, a number of arrangements, and an arrangement portion, and the like of each of the semiconductor devices 3a to 3d are appropriately changeable.

As illustrated in FIG. 3, for example, the semiconductor module 1 according to the present embodiment constitutes an inverter circuit having one phase in a three-phase inverter circuit using the semiconductor devices 3a to 3d. Specifically, the semiconductor module 1 according to the present embodiment includes the semiconductor devices 3a and 3b constituting an upper arm and the semiconductor devices 3c and 3d constituting a lower arm each having one phase in the three-phase inverter circuit. Each of the semiconductor devices 3a to 3b has a gate electrode (not illustrated) and an emitter electrode or a source electrode (not illustrated) on its upper surface and has a collector electrode or a drain electrode (not illustrated) on its lower surface.

The collector electrode or the drain electrode of the semiconductor device 3a is connected to the collector electrode or the drain electrode of the semiconductor device 3b via the conductive layer 22a. The emitter electrode or the source electrode of the semiconductor device 3a is connected to the emitter electrode or the source electrode of the semiconductor device 3b via the metal wiring board 4b. That is, the semiconductor devices 3a and 3b are connected in parallel with each other by the metal wiring board 4b and the conductive layer 22a.

The collector electrode or the drain electrode of the semiconductor device 3c is connected to the collector electrode or the drain electrode of the semiconductor device 3d via the conductive layer 22b. The emitter electrode or the source electrode of the semiconductor device 3c is connected to the emitter electrode or the source electrode of the semiconductor device 3d via the metal wiring board 4c. That is, the semiconductor devices 3c and 3d are connected in parallel with each other by the metal wiring board 4c and the conductive layer 22b.

The collector electrode or the drain electrode of each of the semiconductor devices 3a and 3b is connected to the external terminal P via the metal wiring board 4a.

The emitter electrode or the source electrode of each of the semiconductor devices 3a and 3b is connected to the external terminal M via the metal wiring board 4b.

The collector electrode or the drain electrode of each of the semiconductor devices 3c and 3d is connected to the external terminal M via the conductive layer 22b and the metal wiring board 4b.

The emitter electrode or the source electrode of each of the semiconductor devices 3c and 3d is connected to the external terminal N via the metal wiring board 4c.

Each of the metal wiring boards 4a to 4c is formed by being folded through press working using a metal plate made of a copper material, a copper alloy-based material, an aluminum alloy-based material, or an iron alloy-based material, for example.

The metal wiring board 4a includes a bonding section 40, a raised section 41, and a bent section 42. A lower surface of the bonding section 40 is bonded to the conductive layer 22a, and an end portion of an upper surface on the positive side in the X-direction of the bonding section 40 is connected to one end of the raised section 41. The other end of the raised section 41 is connected to an end portion of a lower surface on the positive side in the X-direction of the bent section 42, and an upper surface of the bent section 42 is bonded to one end of the external terminal P with a solder, a bolt, or the like. That is, the metal wiring board 4a electrically connects the conductive layer 22a and the external terminal P to each other.

The metal wiring board 4b includes bonding sections 43 to 45, coupling sections 46 and 47, a raised section 48, and a bent section 49. Although the metal wiring boards 4b and 4c have the same shape, only the metal wiring board 4b is illustrated in FIGS. 4A and 4B.

In the metal wiring board 4b, a lower surface of the bonding section 43 is bonded to the upper surface of the semiconductor device 3a, and a lower surface of the bonding section 44 is bonded to the upper surface of the semiconductor device 3b. An end portion of an upper surface on the negative side in the X-direction of the bonding section 43 is connected to one end of the coupling section 46, an end portion of an upper surface on the negative side in the X-direction of the bonding section 44 is connected to one end of the coupling section 47, and the respective other ends of the coupling sections 46 and 47 are connected to an end portion of an upper surface in the X-direction of the bonding section 45. That is, the coupling sections 46 and 47 respectively couple the bonding section 43 and the bonding section 45 and the bonding section 44 and the bonding section 45 to each other. A lower surface of the bonding section 45 is bonded to the conductive layer 22b, and an end portion of an upper surface on the negative side in the X-direction of the bonding section 45 is connected to one end of the raised section 48, and the other end of the raised section 48 is connected to an end portion of a lower surface on the negative side in the X-direction of the bent section 49. That is, the raised section 48 is formed to rise upward from the end portion of the bonding section 45. An upper surface of the bent section 49 is bonded to one end of the external terminal M with a solder, a bolt, or the like.

That is, the metal wiring board 4b electrically connects the semiconductor devices 3a and 3b to the external terminal M via the conductive layer 22b. Thus, the metal wiring board 4b is mounted on the semiconductor devices 3a and 3b and the conductive layer 22b at three points, respectively, by the bonding sections 43 to 45, thereby making it possible to improve the stability of the metal wiring board 4b after the mounting.

In the metal wiring board 4c, a lower surface of the bonding section 43 is bonded to the upper surface of the semiconductor device 3c, and a lower surface of the bonding section 44 is bonded to the upper surface of the semiconductor device 3d. An end portion of an upper surface on the positive side in the X-direction of the bonding section 43 is connected to one end of the coupling section 46, an end portion of an upper surface on the positive side in the X-direction of the bonding section 44 is connected to one end of the coupling section 47, and the respective other ends of the coupling sections 46 and 47 are bonded to an end portion of an upper surface on the negative side in the X-direction of the bonding section 45. That is, the coupling sections 46 and 47 respectively couple the bonding section 43 and the bonding section 45 and the bonding section 44 and the bonding section 45 to each other. A lower surface of the bonding section 45 is connected to the conductive layer 22c, an end portion of an upper surface on the positive side in the X-direction of the bonding section 45 is connected to one end of the raised section 48, and the other end of the raised section 48 is connected to an end portion of a lower surface on the positive side in the X-direction of the bent section 49. That is, the raised section 48 is formed to rise upward from the end portion of the bonding section 45. An upper surface of the bent section 49 is bonded to one end of the external terminal N with a solder, a bolt, or the like.

That is, the metal wiring board 4c electrically connects the semiconductor devices 3c and 3d to the external terminal N via the conductive layer 22c. The metal wiring board 4c thus configured is mounted on the semiconductor devices 3c and 3d and the conductive layer 22c at three points, respectively, by the bonding sections 43 to 45, thereby making it possible to improve the stability of the metal wiring board 4c after the mounting.

In each of the metal wiring boards 4b and 4c, the bent section 49 is bent toward the coupling sections 46 and 47, whereby the bent section 49 and the bonding section 45 can at least partially overlap in a planar view. Therefore, a mounting area of the metal wiring boards 4b and 4c can be relatively reduced.

As illustrated in FIG. 4B, a distance a from an end portion on the negative side in the Y-direction of the bonding section 43 and an end portion on the positive side in the Y-direction of the bonding section 44 is desirably longer than a distance b from an end portion on the negative side in the Y-direction of the bonding section 45 to an end portion on the positive side in the Y-direction of the bonding section 45. When the distance a is thus more than the distance b, the mounting area of the metal wiring board 4b can be relatively reduced.

As illustrated in FIG. 4B, the distance b is desirably longer than a distance c from an end portion on the negative side in the Y-direction of the bent section 49 to an end portion on the positive side in the Y-direction of the bent section 49. When the distance b is thus more than the distance c, a fillet occurring around the bonding section 45 in the Y-direction can be confirmed in a planar view when the bonding section 45 is mounted on the conductive layer 22b using a solder.

As illustrated in FIG. 4B, a distance f from the end portion on the positive side in the X-direction of the bonding section 45 to an end portion on the negative side in the X-direction of the bonding section 45 is desirably longer than a distance e from the end portion on the positive side in the X-direction of the bent section 49 to an end portion on the negative side in the X-direction of the bent section 49. When the distance f is thus more than the distance e, a fillet occurring around the bonding section 45 in the X-direction can be confirmed in a planar view when the bonding section 45 is mounted on the conductive layer 22b using a solder.

As illustrated in FIG. 4B, the distance e is desirably shorter than a distance g from an end portion on the positive side in the X-direction of the conductive layer 22b to an end portion on the negative side in the X-direction of the conductive layer 22b. The distance e may be less than the distance g while the bent section 49 does not overhang on an area between the conductive layers 22a and 22b in a planar view. When the distance e is thus less than the distance g, the mounting area of the metal wiring board 4b can be relatively reduced in a planar view.

Similarly for the metal wiring board 4c, it is desirable that the distance a is more than the distance b, the distance b is more than the distance c, the distance f is more than the distance e, and the distance e is less than the distance g.

A shape of the metal wiring board 4b illustrated in FIGS. 4A and 4B is merely an example, and is appropriately changeable.

Figure 5A:
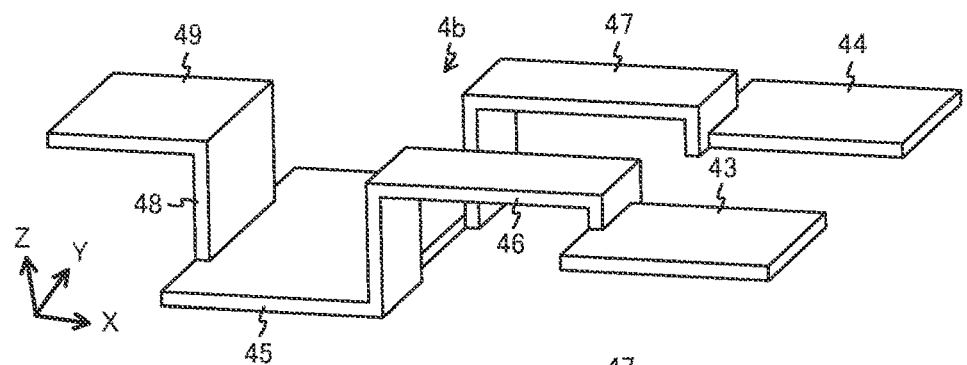
FIGS. 5A to 5E are diagrams each illustrating another example of the metal wiring board.

For example, the bent section 49 may be formed to extend toward the negative side in the X-direction, like in the metal wiring board 4b illustrated in FIG. 5A. That is, the bent section 49 is bent in a direction away from the coupling sections 46 and 47 in the metal wiring board 4b illustrated in FIG. 5A.

Figure 5B:
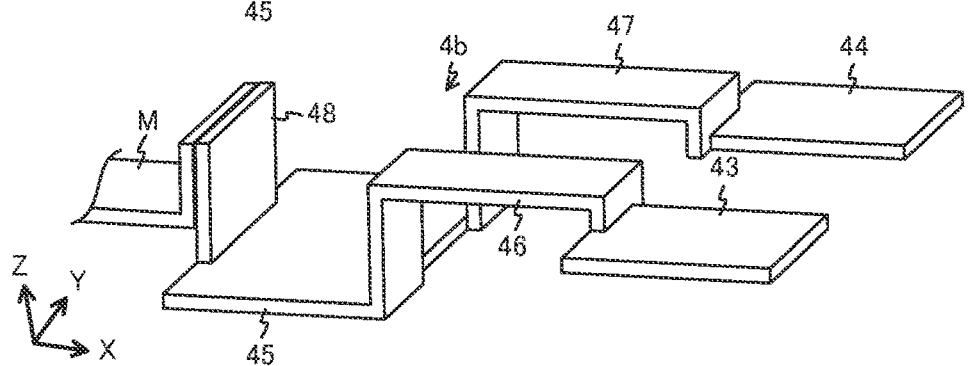

The bent section 49 may be omitted and an external terminal M formed in an L shape may be bonded to the raised section 48, like in the metal wiring board 4b illustrated in FIG. 5B.

Figure 5C:
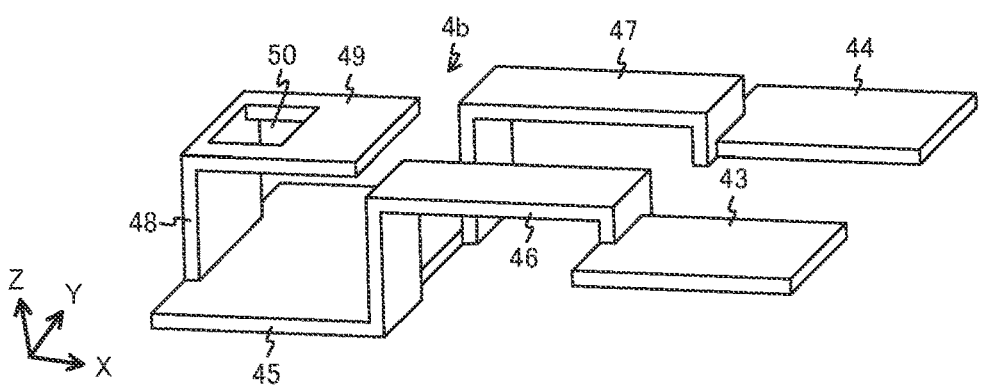

The bent section 49 may be provided with a through hole 50, like in the metal wiring board 4b illustrated in FIG. 5C. A position and a size of the through hole 50 are not particularly limited. When the bent section 49 is thus provided with the through hole 50, mold resin can be dropped on the upper surface side of the bonding section 45 through the through hole 50 when the case 11 is filled with the mold resin. Accordingly, the case 11 can be sufficiently filled with the mold resin between an upper surface of the bonding section 45 and a lower surface of the bent section 49.

Figure 5D:
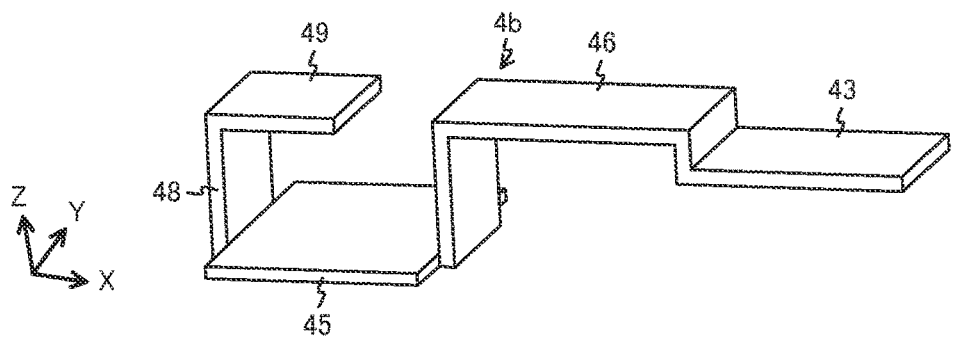

If the number of semiconductor devices to be connected to the metal wiring board 4b is one, the bonding section 44 and the coupling section 47 may be omitted, like in the metal wiring board 4b illustrated in FIG. 5D.

Figure 5E:
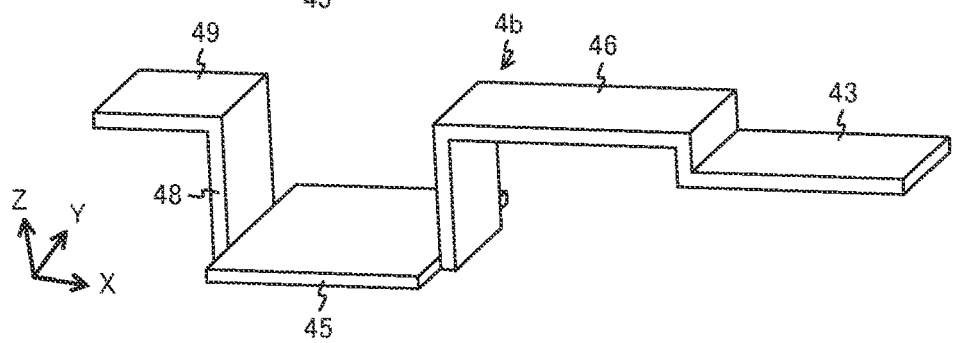

If the number of semiconductor devices to be connected to the metal wiring board 4b is one, the bonding section 44 and the coupling section 47 may be omitted and the bent section 49 may be bent in a direction away from the coupling section 46, like in the metal wiring board 4b illustrated in FIG. 5E.

<Method for Manufacturing Semiconductor Module 1 According to Embodiment>

As a method for manufacturing a semiconductor module 1 illustrated in FIGS. 1 and 2, the following items 1) to 6) are considered.

1) First, semiconductor devices 3a to 3d are mounted on a laminate substrate 2.
2) Then, metal wiring boards 4a to 4c and a wire (not illustrated) are bonded to the laminate substrate 2 and the semiconductor devices 3a to 3d.
3) Then, a case 11 is mounted on the laminate substrate 2.
4) Then, the case 11 is filled with mold resin.
5) Then, an external terminal M is passed through a through hole (not illustrated) provided in a side wall portion 11a on the negative side in the X-direction of the case 11, and external terminals P and N are respectively passed through two through holes (not illustrated) provided in the side wall portion 11a on the positive side in the X-direction of the case 11.
6) A bent section 42 in the metal wiring board 4a and one end of the external terminal P are bonded to each other, a bent section 49 in the metal wiring board 4b and one end of the external terminal M are bonded to each other, and a bent section 49 in the metal wiring board 4c and one end of the external terminal N are bonded to each other.

When the external terminals M, P, and N are previously attached to the case 11, the foregoing item 5) is omitted.

In an existing semiconductor module, to prevent heat to be generated in a semiconductor device from being transferred to an external terminal via a metal wiring board, the semiconductor device and a conductive layer on a laminate substrate are connected to each other via the metal wiring board, and the conductive layer and the external terminal are connected to each other via another metal wiring board. According to the semiconductor module thus configured, heat to be generated in the semiconductor device can be dissipated by the laminate substrate.

However, in the semiconductor module thus configured, two metal wiring boards need to be connected between the semiconductor device and the external terminal. Therefore, the semiconductor module may increase in size due to an increase in a mounting area of the metal wiring boards.

In the semiconductor module 1 according to the embodiment, the bonding sections 45 in the metal wiring boards 4b and 4c are respectively provided with at least the raised sections 48, and the external terminals M and N are respectively connected to the metal wiring boards 4b and 4c via the raised sections 48. The bonding sections 45 are respectively bonded to the conductive layers 22b and 22c. Accordingly, heat to be generated by the semiconductor devices 3a and 3b and heat to be generated by the semiconductor devices 3c to 3d can be respectively dissipated from the conductive layers 22b and 22c. To connect the conductive layers 22b and 22c, respectively, to the external terminals M and N, a metal wiring board other than the metal wiring boards 4b and 4c need not be further prepared. Accordingly, a mounting area of the metal wiring boards 4b and 4c can be prevented from increasing.

The metal wiring boards 4b and 4c respectively have the bent sections 49 extending parallel to the external terminals M and N, thereby making it possible to achieve a stability at the time of bonding between the external terminals M and N and the metal wiring boards 4b and 4c.

The semiconductor module 1 according to the embodiment has a configuration in which the external terminals M and N are respectively connected to the metal wiring boards 4b and 4c via the raised sections 48. Accordingly, the configuration is favorable when positions in the Z-direction of the external terminals M and N are respectively higher than positions in the Z-direction of the bonding sections 45.

Modified Example

Figure 6A:
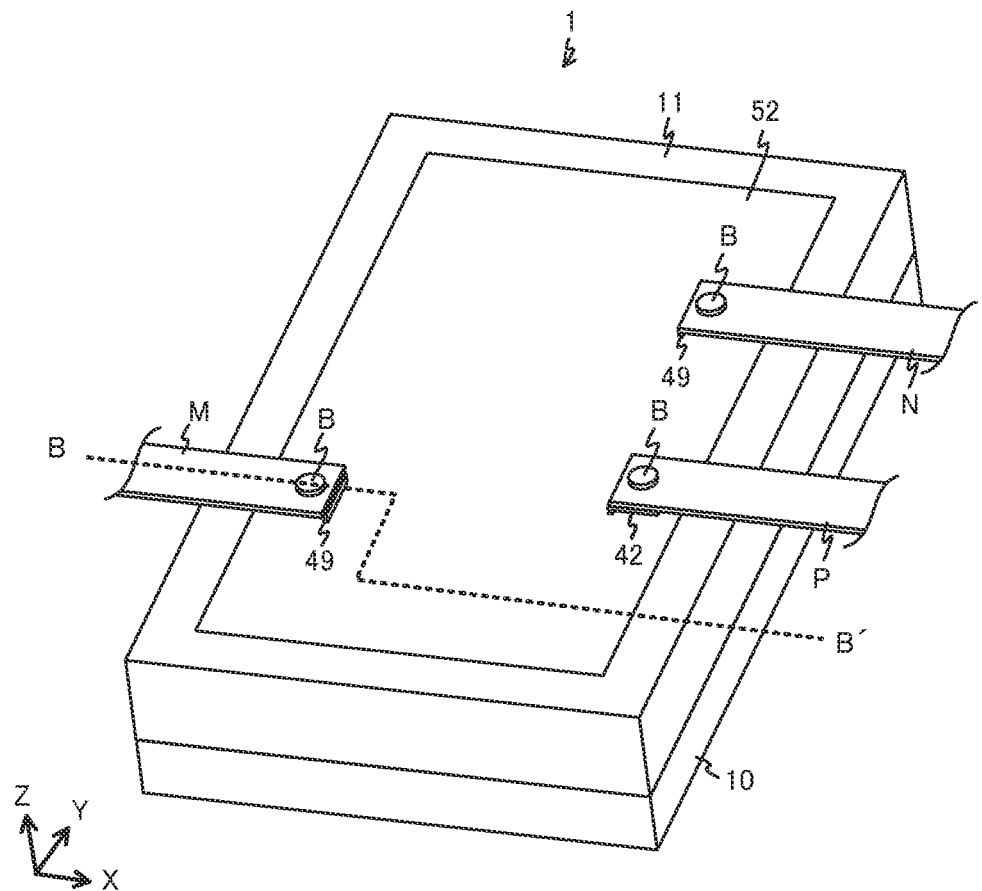
FIGS. 6A and 6B are respectively a perspective view and a cross-sectional view of a semiconductor module according to another embodiment.
Figure 6B:
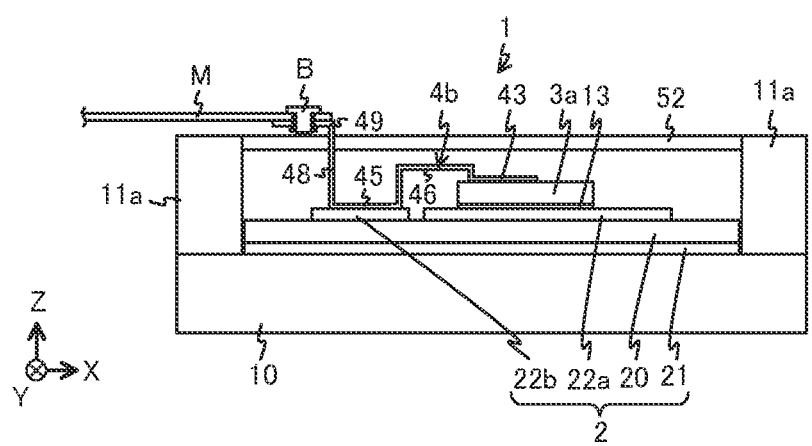

FIG. 6A is a perspective view illustrating a modified example of the semiconductor module 1 according to the embodiment, and FIG. 6B is a cross-sectional view taken along a line B-B' of the semiconductor module 1 illustrated in FIG. 6A. In FIGS. 6A and 6B, the same components as the components illustrated in FIGS. 1 and 2 are assigned the same reference numerals, and description thereof is omitted.

The semiconductor module 1 illustrated in FIGS. 6A and 6B differs from the semiconductor module 1 illustrated in FIGS. 1 and 2 in that a bent section 42 in a metal wiring board 4a and an external terminal P are bonded to each other with a bolt B outside a case 11, a bent section 49 in a metal wiring board 4b and an external terminal M are bonded to each other with a bolt B outside the case 11, and a bent section 49 in a metal wiring board 4c and an external terminal N are bonded to each other with a bolt B outside the case 11. Other components in the semiconductor module 1 illustrated in FIGS. 6A and 6B are the same as those in the semiconductor module 1 illustrated in FIGS. 1 and 2.

<Method for Manufacturing Modified Example of Semiconductor Module 1 According to Embodiment>

As a method for manufacturing a modified example of the semiconductor module 1 according to the embodiment, the following items 7) to 13) are considered.

Figure 7:
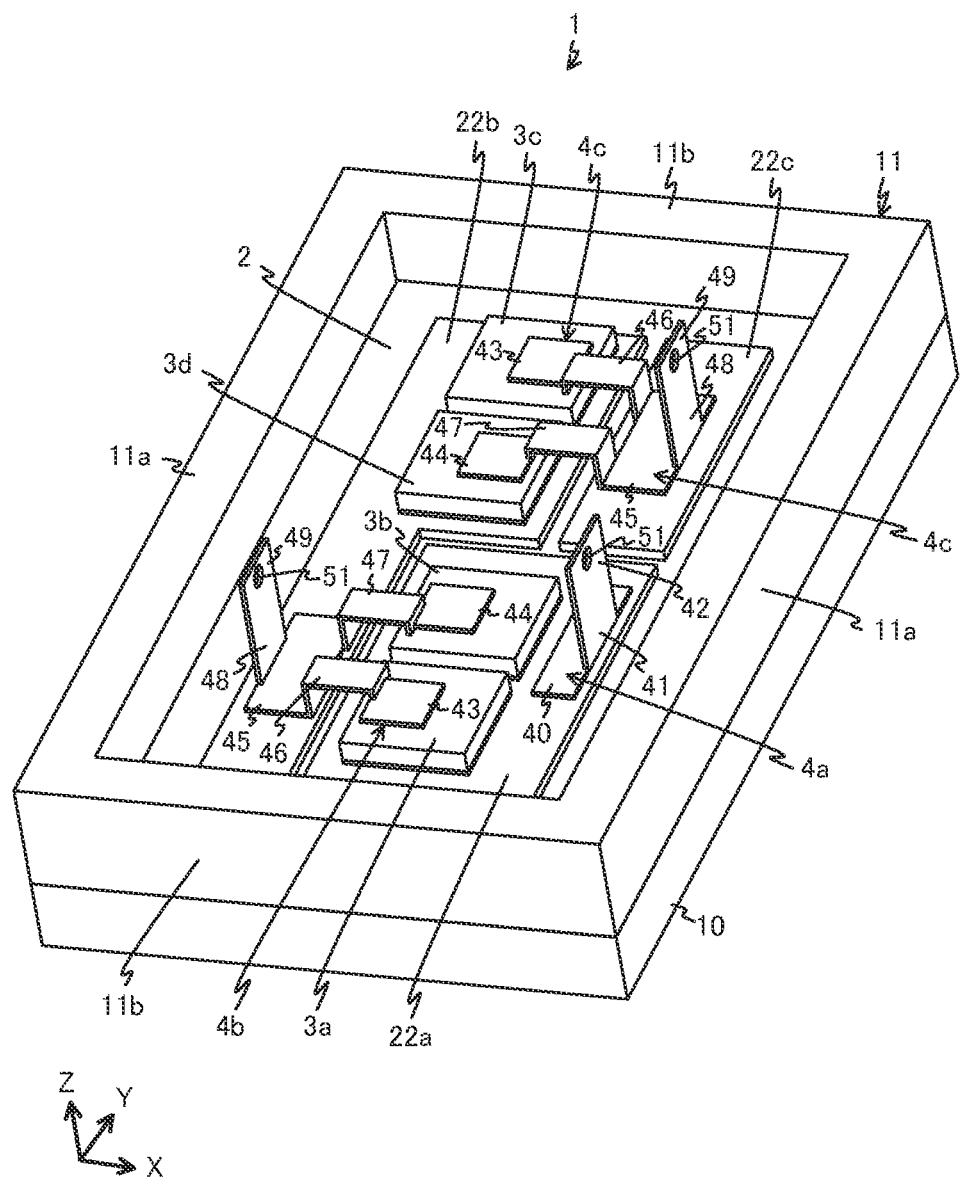
FIG. 7 is a diagram illustrating a process (1) for manufacturing the semiconductor module according to the other embodiment.
Figure 8:
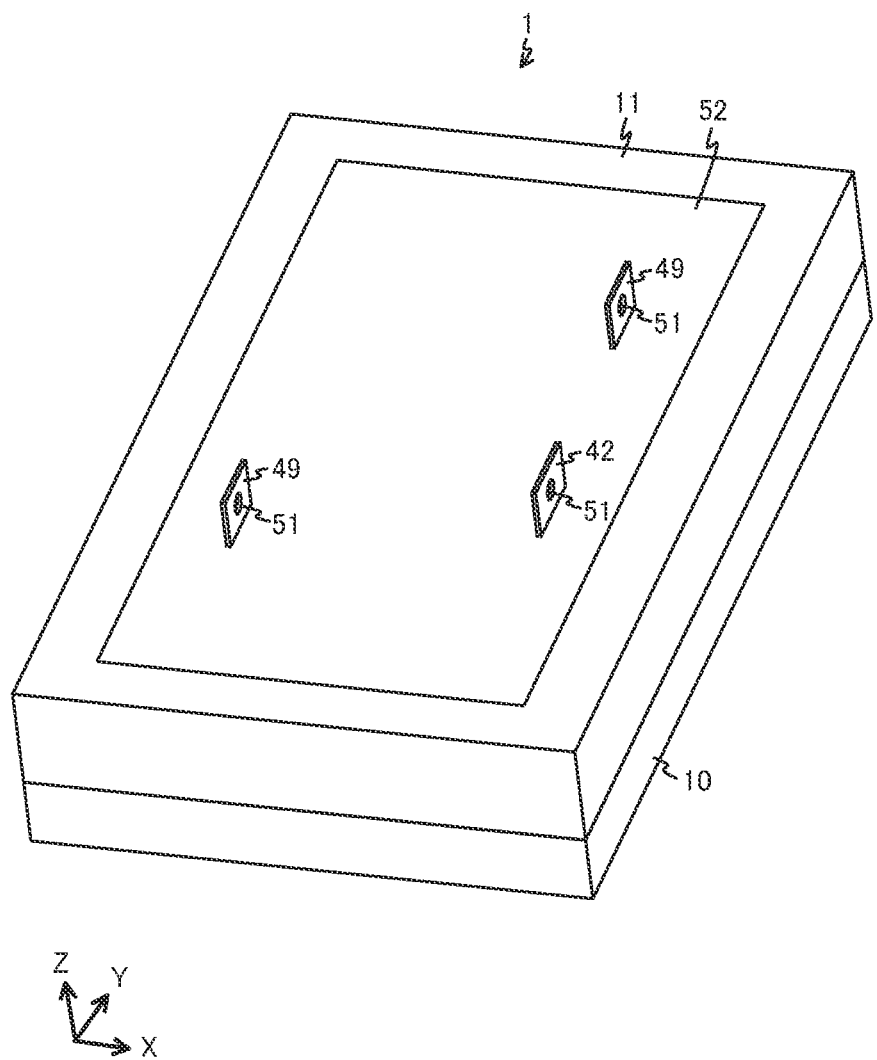
FIG. 8 is a diagram illustrating a process (2) for manufacturing the semiconductor module according to the other embodiment.
Figure 9:
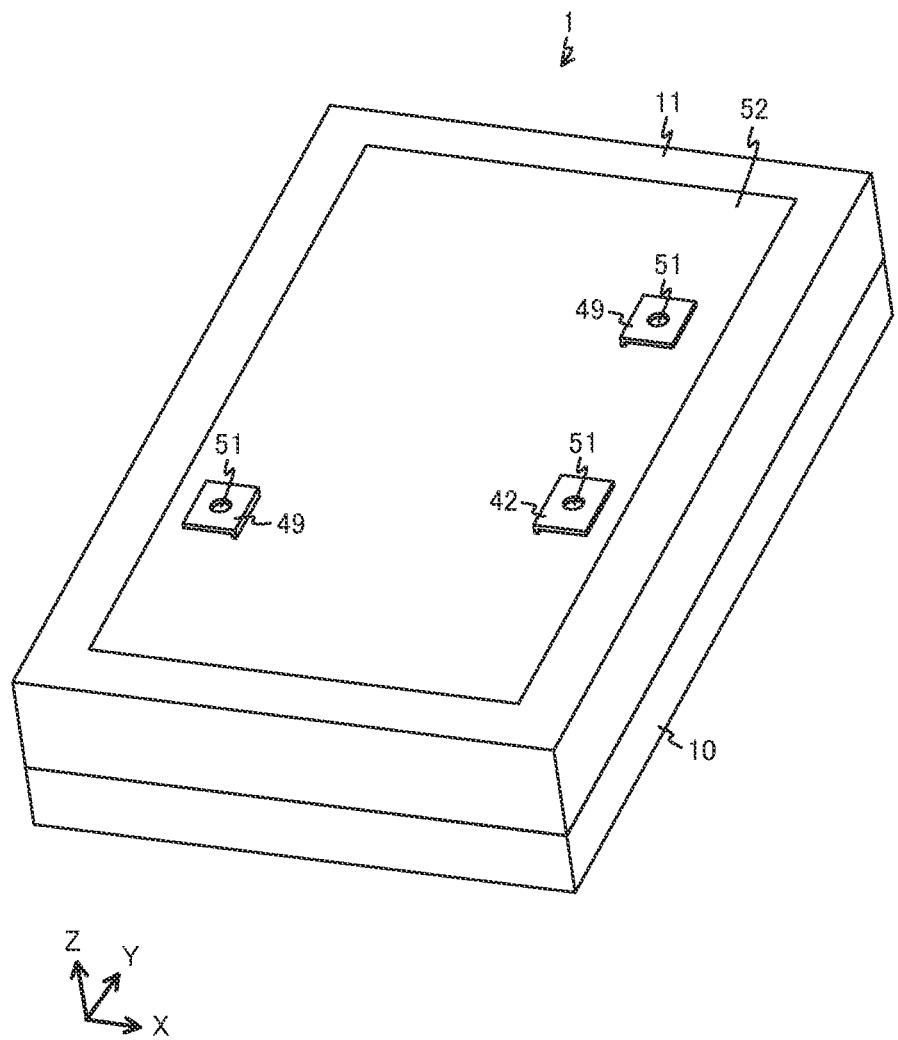
FIG. 9 is a diagram illustrating a process (3) for manufacturing the semiconductor module according to the other embodiment.

7) First, semiconductor devices 3a to 3d are mounted on a laminate substrate 2.
8) Then, metal wiring boards 4a to 4c and a wire (not illustrated) are bonded to the laminate substrate 2 and the semiconductor devices 3a to 3d.
9) Then, as illustrated in FIG. 7, a case 11 is mounted on the laminate substrate 2. In the metal wiring boards 4a, 4b, and 4c illustrated in FIG. 7, respectively, bent sections 42, 49, and 49 extend in the Z-direction. That is, in each of the metal wiring boards 4b and 4c in the modified example of the semiconductor module 1, the bent section 49 is not bent at the time of mounting. In the metal wiring boards 4a, 4b, and 4c illustrated in FIG. 7, respectively, the bent sections 42, 49, and 49 are each provided with a through hole 51 through which a bolt B is passed.
10) Then, the case 11 is filled with mold resin.
11) Then, a cover 52 is arranged on an upper surface of the case 11 while the bent sections 42, 49, and 49 are respectively passed through three through holes (not illustrated) previously provided in the cover 52, as illustrated in FIG. 8.
12) Then, as illustrated in FIG. 9, the bent section 42 in the metal wiring board 4a is bent toward the positive side in the X-direction, the bent section 49 in the metal wiring board 4b is bent toward the negative side in the X-direction, and the bent section 49 in the metal wiring board 4c is bent toward the positive side in the X-direction.
13) As illustrated in FIGS. 6A and 6B, the bent section 42 in the metal wiring board 4a and the external terminal P are bonded to each other with the bolt B, the bent section 49 in the metal wiring board 4b and the external terminal M are bonded to each other with the bolt B, and the bent section 49 in the metal wiring board 4c and the external terminal N are bonded to each other with the bolt B.

In the modified example of the semiconductor module 1 according to the embodiment, bonding sections 45 in the metal wiring boards 4b and 4c are respectively provided with at least raised sections 48, and the external terminals M and N are respectively connected to the metal wiring boards 4b and 4c via the raised sections 48. The bonding sections 45 are respectively bonded to conductive layers 22b and 22c. Accordingly, heat to be generated by the semiconductor devices 3a and 3b and heat to be generated by the semiconductor devices 3c to 3d can be respectively dissipated from the conductive layers 22b and 22c. To connect the conductive layers 22b and 22c, respectively, to the external terminals M and N, a metal wiring board other than the metal wiring boards 4b and 4c need not be further prepared. Accordingly, a mounting area of the metal wiring boards 4b and 4c can be prevented from increasing.

In the above-described embodiment, the number of semiconductor devices and an arrangement portion of each of the semiconductor devices are not limited to those in the above-described configuration, but are appropriately changeable.

In the above-described embodiment, the number of conductive layers and a layout of the conductive layers are not limited to those in the above-described configuration, but are appropriately changeable.

Although the laminate substrate and the semiconductor device are formed in a rectangular shape or a square shape in a planar view in the above-described embodiment, the present invention is not limited to the shape. The laminate substrate and the semiconductor device may be each formed in a polygonal shape other than the above-described shape.

Although a case where the upper arm is positioned on the negative side in the Y-direction and the lower arm is positioned on the positive side in the Y-direction has been described in the above-described embodiment, the present invention is not limited to this configuration. A positional relationship between upper and lower arms may be reverse to the foregoing one.

As still another embodiment, the present invention may be an overall or partial combination of the above-described embodiment and modified example as another embodiment.

The present embodiment is not limited to the above-described embodiment and modified example, but various changes, replacements, and modifications may be made without departing from the spirit of the technical idea. Further, if the technical idea can be implemented using another method by advancement of technology or derivative other technologies, the technical idea may be implemented using the method. Therefore, the claims cover all implementations that can be included in the scope of the technical idea.

Feature points in the above-described embodiment are summarized below.

A semiconductor module (1) described in the above-described embodiment includes a laminate substrate (2) in which at least a first circuit board (22a) and a second circuit board (22b) are arranged on an upper surface of an insulating plate (20), at least one first semiconductor device (3a) arranged on an upper surface of the first circuit board (22a), a first main terminal (M), and a first metal wiring board (4b) that electrically connects the at least one first semiconductor device (3a) and the first main terminal (M) to each other, in which the first metal wiring board (4b) includes at least one first bonding section (43) bonded to an upper surface electrode of the at least one first semiconductor device, a second bonding section (45) bonded to an upper surface of the second circuit board, at least one first coupling section (46) that couples the first bonding section and the second bonding section to each other, and a first raised section (48) that rises upward from an end portion of the second bonding section, and an upper end of the first raised section is electrically connected to the first main terminal.

In the semiconductor module described in the above-described embodiment, a first bent section (49) bent in a predetermined direction may be provided at the upper end of the first raised section, and one end of the first main terminal and the first bent section may be bonded to each other.

In the semiconductor module described in the above-described embodiment, the first bent section (49) and the second bonding section (45) may at least partially overlap in a planar view of the semiconductor module.

In the semiconductor module described in the above-described embodiment, the first bent section (49) may be bent toward the at least one first coupling section (46).

In the semiconductor module described in the above-described embodiment, the first bent section (49) may be bent in a direction away from the at least one first coupling section (46).

In the semiconductor module described in the above-described embodiment, the at least one first semiconductor device may include two first semiconductor devices (3a, 3b) arranged side by side in a predetermined direction on the upper surface of the first circuit board (4b), and the at least one first coupling section may include two first coupling sections (46, 47) that respectively couple two of the first bonding sections (43, 44) arranged to correspond to the two first semiconductor devices (3a, 3b) and the second bonding section (45) to each other.

The semiconductor module described in the above-described embodiment, in which a third circuit board (22c) may be further arranged on the upper surface of the insulating plate, may further include at least one second semiconductor device (3c) arranged on an upper surface of the second circuit board, a second main terminal (N), and a second metal wiring board (4c) that electrically connects the at least one second semiconductor device and the second main terminal to each other, in which the second metal wiring board (4c) may include at least one third bonding section (43) bonded to an upper surface electrode of the second semiconductor device, a fourth bonding section (45) bonded to an upper surface of the third circuit board, at least one second coupling section (46) that couples the at least one third bonding section and the fourth bonding section to each other, and a second raised section (48) that rises upward from an end portion of the fourth bonding section, and an upper end of the second raised section may be electrically connected to the second main terminal.

In the semiconductor module described in the above-described embodiment, a second bent section (49) bent in a predetermined direction may be provided at the upper end of the second raised section (48), and one end of the second main terminal and the second bent section may be bonded to each other.

In the semiconductor module described in the above-described embodiment, the second bent section and the fourth bonding section may at least partially overlap in a planar view of the semiconductor module.

In the semiconductor module described in the above-described embodiment, the second bent section may be bent toward the at least one second coupling section.

In the semiconductor module described in the above-described embodiment, the second bent section may be bent in a direction away from the at least one second coupling section.

In the semiconductor module described in the above-described embodiment, the at least one second semiconductor device may include two second semiconductor devices (3c, 3d) arranged side by side in a predetermined direction on the upper surface of the second circuit board, and the at least one second coupling section may include two second coupling sections (46, 47) that respectively couple two of the third bonding sections (43, 44) arranged to correspond to the two second semiconductor devices and the fourth bonding section to each other.

The semiconductor module described in the above-described embodiment may further include a third main terminal (P) electrically connected to the first circuit board, in which the first main terminal may constitute an output terminal (M), the second main terminal may constitute an input terminal (N) on a negative side of the semiconductor module, and the third main terminal may constitute an input terminal (P) on a positive side of the semiconductor module.

In the semiconductor module described in the above-described embodiment, the second main terminal and the third main terminal may be arranged side by side, and the first main terminal may be arranged to oppose the second main terminal and the third main terminal.

As described above, the present invention has an effect of being able to prevent a semiconductor module from increasing in size while preventing heat to be generated by a semiconductor device from being transferred to a main terminal.

REFERENCE SIGNS LIST

1: semiconductor module
2: laminate substrate
20: insulating layer
21: heat dissipation layer
22a to 22c: conductive layer
3a to 3d: semiconductor device
4a to 4c: metal wiring board
40: bonding section
41: raised section
42: bent section
43: bonding section
44: bonding section
45: bonding section
46: coupling section
47: coupling section
48: raised section
49: bent section
M, P, N: external terminal

What is claimed is:

1. A semiconductor module, comprising:
a laminate substrate including an insulating plate, and at least a first circuit board and a second circuit board arranged on an upper surface of the insulating plate;
at least one first semiconductor device arranged on an upper surface of the first circuit board;
a first main terminal; and
a first metal wiring board that electrically connects the at least one first semiconductor device to the first main terminal, wherein
the first metal wiring board has:
at least one first bonding section bonded to an upper surface electrode of the at least one first semiconductor device;
a second bonding section, bonded to an upper surface of the second circuit board;
at least one first coupling section that extends in one direction to directly connect the at least one first bonding section to the second bonding section; and
a first raised section that rises upward from an end portion of the second bonding section, the first raised section having an upper end that is electrically connected to the first main terminal.

2. The semiconductor module according to claim 1, wherein
the first metal wiring board further has a first bent section that is provided at the upper end of the first raised section and bent in a predetermined direction, and
one end of the first main terminal and one end the first bent section are bonded to each other.

3. The semiconductor module according to claim 2, wherein the first bent section and the second bonding section at least partially overlap in a plan view of the semiconductor module.

4. The semiconductor module according to claim 2, wherein the first bent section is bent toward the at least one first coupling section.

5. The semiconductor module according to claim 2, wherein the first bent section is bent in a direction away from the at least one first coupling section.

6. The semiconductor module according to claim 1, wherein
the at least one first semiconductor device includes two first semiconductor devices arranged side by side in a first predetermined direction on the upper surface of the first circuit board,
the at least one first bonding section includes two first bonding sections on which the two first semiconductor devices are respectively arranged, and
the at least one first coupling section includes two first coupling sections that respectively couple the two first bonding sections to the second bonding section.

7. The semiconductor module according to claim 1, wherein the at least one first coupling section and the first raised section are electrically connected to each other via the second bonding section.

8. A semiconductor module, comprising:
a laminate substrate including an insulating plate, and at least a first circuit board and a second circuit board arranged on an upper surface of the insulating plate;
at least one first semiconductor device arranged on an upper surface of the first circuit board;
a first main terminal; and
a first metal wiring board that electrically connects the at least one first semiconductor device to the first main terminal, wherein
the first metal wiring board has:
at least one first bonding section bonded to an upper surface electrode of the at least one first semiconductor device;
a second bonding section bonded to an upper surface of the second circuit board;
at least one first coupling section that couples the at least one first bonding section to the second bonding section; and
a first raised section that rises upward from an end portion of the second bonding section, the first raised section having an upper end that is electrically connected to the first main terminal;
a third circuit board arranged on the upper surface of the insulating plate;
at least one second semiconductor device arranged on an upper surface of the second circuit board;
a second main terminal; and
a second metal wiring board that electrically connects the at least one second semiconductor device to the second main terminal, wherein
the second metal wiring board has:
at least one third bonding section bonded to an upper surface electrode of the at least one second semiconductor device;
a fourth bonding section bonded to an upper surface of the third circuit board;
at least one second coupling section that couples the at least one third bonding section to the fourth bonding section; and
a second raised section that rises upward from an end portion of the fourth bonding section, the second raised section having an upper end that is electrically connected to the second main terminal.

9. The semiconductor module according to claim 8, wherein the second metal wiring board further has a second bent section that is provided at the upper end of the second raised section and bent in a predetermined direction, and one end of the second main terminal and one end the second bent section are bonded to each other.

10. The semiconductor module according to claim 9, wherein the second bent section and the fourth bonding section at least partially overlap in a plan view of the semiconductor module.

11. The semiconductor module according to claim 9, wherein the second bent section is bent toward the at least one second coupling section.

12. The semiconductor module according to claim 9, wherein the second bent section is bent in a direction away from the at least one second coupling section.

13. The semiconductor module according to claim 8, wherein
the at least one second semiconductor device includes two second semiconductor devices arranged side by side in a second predetermined direction on the upper surface of the second circuit board,
the at least one third bonding section includes two third bonding sections on which the two second semiconductor devices are respectively arranged, and
the at least one second coupling section includes two second coupling sections that respectively couple the two third bonding sections to the fourth bonding section.

14. The semiconductor module according to claim 8, further comprising
a third main terminal electrically connected to the first circuit board, wherein
the first main terminal constitutes an output terminal,
the second main terminal constitutes an input terminal on a negative side of the semiconductor module, and
the third main terminal constitutes an input terminal on a positive side of the semiconductor module.

15. The semiconductor module according to claim 14, wherein
the second main terminal and the third main terminal are arranged side by side at one side of the laminate substrate, and
the first main terminal is arranged at an other side of the laminate substrate that is parallel to and opposes the one side at which the second main terminal and the third main terminal are arranged.

16. A semiconductor module, comprising:
a laminate substrate including an insulating plate, and at least a first circuit board and a second circuit board arranged on an upper surface of the insulating plate;
at least one first semiconductor device arranged on an upper surface of the first circuit board;
a first main terminal; and
a first metal wiring board that electrically connects the at least one first semiconductor device to the first main terminal, wherein
the first metal wiring board has:
at least one first bonding section bonded to an upper surface electrode of the at least one first semiconductor device;
a second bonding section bonded to an upper surface of the second circuit board;
at least one first coupling section that couples the at least one first bonding section to the second bonding section; and
a first raised section that rises upward from one of two opposing ends of the second bonding section, the one end being opposite to the other end to which the at least one first coupling section is physically connected, the first raised section having an upper end that is electrically connected to the first main terminal.

* * * * *